US010861813B2

(12) United States Patent
Ishio

(10) Patent No.: US 10,861,813 B2
(45) Date of Patent: Dec. 8, 2020

(54) SEMICONDUCTOR CHIP STACK AND METHOD FOR MANUFACTURING SEMICONDUCTOR CHIP STACK

(71) Applicant: SHARP KABUSHIKI KAISHA, Sakai (JP)

(72) Inventor: Toshiya Ishio, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/422,580

(22) Filed: May 24, 2019

(65) Prior Publication Data
US 2019/0371756 A1 Dec. 5, 2019

(30) Foreign Application Priority Data
May 30, 2018 (JP) .................................. 2018-103563

(51) Int. Cl.
*H01L 23/00* (2006.01)

(52) U.S. Cl.
CPC .............. *H01L 24/16* (2013.01); *H01L 24/11* (2013.01); *H01L 24/13* (2013.01); *H01L 24/81* (2013.01); *H01L 2224/1131* (2013.01); *H01L 2224/11462* (2013.01); *H01L 2224/11464* (2013.01); *H01L 2224/13082* (2013.01);
(Continued)

(58) Field of Classification Search
CPC ......... H01L 24/16; H01L 24/11; H01L 24/81; H01L 24/13; H01L 2224/16501; H01L 2224/16145; H01L 2224/1601; H01L 2224/13169; H01L 2224/13164; H01L 2224/13155; H01L 2224/13147; H01L 2224/13144; H01L 2224/13139; H01L 2224/13116; H01L 2224/13111; H01L 2224/13109; H01L 2224/13082; H01L 2924/12041; H01L 2924/1426; H01L 2924/1033; H01L 2924/10329; H01L 2924/10253; H01L 2924/351; H01L 2224/11462; H01L 2224/11464; H01L 2224/1131; H01L 2224/8183; H01L 2224/81203; H01L 23/481; H01L 21/4885; H01L 2224/81359; H01L 2224/81345
See application file for complete search history.

(56) References Cited

U.S. PATENT DOCUMENTS 7,112,525 B1 * 9/2006 Bhansali ........... H01L 21/76838
257/E21.582
2003/0113979 A1 * 6/2003 Bieck ...................... H01L 24/94
438/411
(Continued)

FOREIGN PATENT DOCUMENTS

JP 2002-305215 A 10/2002

*Primary Examiner* — Marcos D. Pizarro
*Assistant Examiner* — Sue Tang
(74) *Attorney, Agent, or Firm* — ScienBiziP, P.C.

(57) ABSTRACT

A semiconductor chip stack includes a first semiconductor chip, a second semiconductor chip, and a connection via which the first electrode and the second electrode are electrically connected to each other. The connection includes a first column and a second column. The first column is constituted by a material having a higher degree of activity with respect to heat than a material that constitutes the second column and is smaller in volume than the second column. Further, the connection has an aspect ratio of 0.5 or higher in a height direction.

12 Claims, 6 Drawing Sheets

(52) U.S. Cl.
CPC ............ *H01L 2224/13109* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/1601* (2013.01); *H01L 2224/16145* (2013.01); *H01L 2224/16501* (2013.01); *H01L 2224/8183* (2013.01); *H01L 2224/81203* (2013.01); *H01L 2924/1033* (2013.01); *H01L 2924/10253* (2013.01); *H01L 2924/10329* (2013.01); *H01L 2924/12041* (2013.01); *H01L 2924/1426* (2013.01); *H01L 2924/351* (2013.01)

(56) References Cited

U.S. PATENT DOCUMENTS

| | | | | |
|---|---|---|---|---|
| 2007/0020916 | A1* | 1/2007 | Farnworth | H05K 3/4007 438/622 |
| 2015/0318254 | A1* | 11/2015 | Thacker | H01L 24/16 257/737 |

* cited by examiner

SEMICONDUCTOR CHIP STACK AND METHOD FOR MANUFACTURING SEMICONDUCTOR CHIP STACK

BACKGROUND

1. Field

The present disclosure relates, for example, to a semiconductor chip stack in which a first semiconductor chip having a first electrode and a second semiconductor chip having a second electrode are electrically connected to each other.

2. Description of the Related Art

In recent years, along with a reduction in size and increase in speed of small-sized electronic apparatuses, there has been a growing demand for a reduction in size, increase in packaging density, and increase in speed of electronic components, and an interconnect technology with which to electrically connect semiconductor chips directly to each other without using a bonding wire has become of importance. In particular, with advanced miniaturization today, there is a demand for joining at low temperature with minor damage.

Japanese Unexamined Patent Application Publication No. 2002-305215 discloses a semiconductor chip stack (FIGS. 6 and 7) in which a first semiconductor chip 101 and a second semiconductor chip 102 are connected to each other by direct bonding via one type of junction made of gold or the like (in the example shown in FIG. 6, a connection 103; in the example shown in FIG. 7, a connection 104).

However, in a case where gold is used as a junction material as in the case of the technology of Japanese Unexamined Patent Application Publication No. 2002-305215, there is a need for thermocompression at 350° C.; therefore, the junction is affected by warpage, bending, or the like of the semiconductor chips after cooling. Further, in a case where the material that constitutes the semiconductor chips is a compound semiconductor, there is concern for damage by heat and pressure.

Further, in a case where a first semiconductor chip and a second semiconductor chip are composed of different materials (e.g. a case where the first semiconductor chip is made of silicon and the second semiconductor chip is made of a GaN compound semiconductor) and are different in coefficient of linear expansion from each other, a difference between temperature at the time of joining and temperature after cooling makes it difficult to perform alignment at the time of bonding. Further, even in a case where alignment has been successfully performed, there occurs a problem such as the occurrence of rupture due to stress applied to the junction after bonding.

Further, a possible example of a method for bonding at a low temperature of approximately 250° C. involves the use of solder paste. In this case, the state of the paste at the point of time of joining makes it difficult to secure a desired space between the first semiconductor chip and the second semiconductor chip.

Further, in an interconnection between highly-miniaturized semiconductor chips, the junction needs to be of a minute size, as the semiconductor chips have miniaturized wires and electrode patterns. In this case, the conventional paste with which to mount a semiconductor device on a printed circuit board or the like are large in particle diameter and too large for interconnecting electrodes.

Further, what is more, in the interconnect technology, the spacing between electrodes that are present within a plane in a direction parallel to the semiconductor chips is extremely narrow; therefore, a short circuit between the electrodes easily occurs due to ion migration.

It is desirable to achieve a semiconductor chip stack in which a first semiconductor chip and a second semiconductor chip are suitably joined to each other.

It is desirable to achieve a method for manufacturing a semiconductor chip stack that makes it possible to suitably join a first semiconductor chip and a second semiconductor chip to each other.

SUMMARY

According to an aspect of the disclosure, there is provided a semiconductor chip stack including: a first semiconductor chip having a first electrode; a second semiconductor chip having a second electrode; and a connection via which the first electrode and the second electrode are electrically connected to each other, the first semiconductor chip and the second semiconductor chip being stacked, wherein the connection includes a first column and a second column that are lined up along a direction in which the first semiconductor chip and the second semiconductor chip are stacked, the first column is constituted by a material having a higher degree of activity with respect to heat than a material that constitutes the second column and is smaller in volume than the second column, and the connection has an aspect ratio of 0.5 or higher in a height direction.

According to an aspect of the disclosure, there is provided a method for manufacturing a semiconductor chip stack including a first semiconductor chip having a first electrode, a second semiconductor chip having a second electrode, and a connection via which the first electrode and the second electrode are electrically connected to each other, the first semiconductor chip and the second semiconductor chip being stacked, the method including: forming a second column on the first semiconductor chip or the second semiconductor chip as a part of the connection; forming a first column on the first semiconductor chip or the second semiconductor chip as a part of the connection along a direction in which the first semiconductor chip and the second semiconductor chip are stacked, the first column (1) being constituted by a material having a higher degree of activity with respect to heat than a material that constitutes the second column and (2) being smaller in volume than the second column; and joining the first semiconductor chip and the second semiconductor chip to each other via the first column, wherein the connection has an aspect ratio of 0.5 or higher in a height direction.

DESCRIPTION OF THE EMBODIMENTS

Embodiment 1

The following describes an embodiment of the present disclosure in detail.

Structure of Semiconductor Chip Stack 1A

Figure 1A:
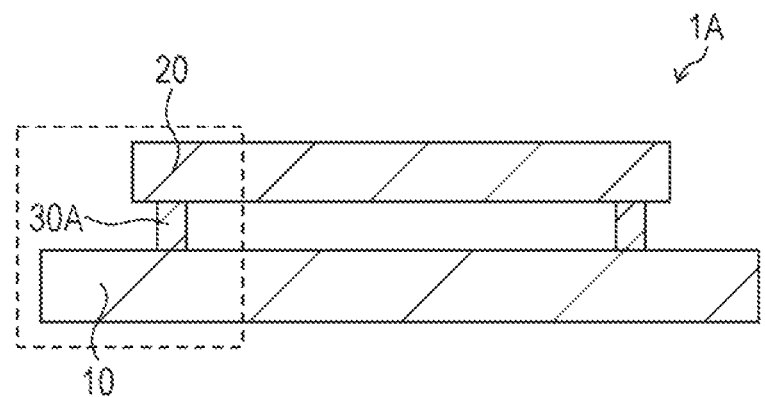
FIG. 1A is a cross-sectional view showing a structure of a semiconductor chip stack according to Embodiment 1 of the present disclosure.
Figure 1B:
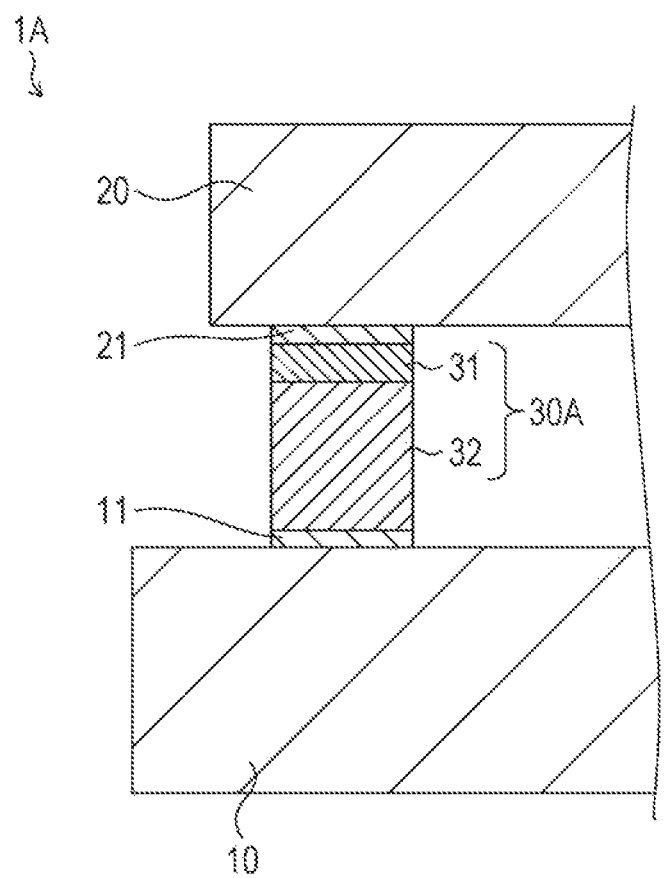
FIG. 1B is an enlarged view of a part of FIG. 1A surrounded by dotted lines.

FIG. 1A is a cross-sectional view showing a structure of a semiconductor chip stack 1A according to Embodiment 1, and FIG. 1B is an enlarged view of a part of FIG. 1A surrounded by dotted lines. As shown in FIG. 1A, the semiconductor chip stack 1A includes a first semiconductor chip 10, a second semiconductor chip 20, and a connection 30A.

The first semiconductor chip 10 has a first electrode 11 provided on a surface thereof that faces the second semiconductor chip 20. The second semiconductor chip 20 has a second electrode 21 provided on a surface thereof that faces the first semiconductor chip 10.

The connection 30A electrically connects the first electrode 11 and the second electrode 21 to each other. As shown in FIG. 1B, the connection 30A includes a first column 31 and a second column 32.

The first column 31 is columnar in shape. The shape of a cross-section of the first column 31 that is perpendicular to a direction (in FIG. 1, a vertical direction) in which the first semiconductor chip 10 and the second semiconductor chip 20 are stacked is a rectangle. The first column 31 has a first end connected to the second electrode 21 and a second end connected to the second column 32.

The second column 32 is columnar in shape. The shape of a cross-section of the second column 32 that is perpendicular to a direction (in FIG. 1, a vertical direction) in which the first semiconductor chip 10 and the second semiconductor chip 20 are stacked is a rectangle that is similar in size to the shape of the cross-section of the first column 31. The second column 32 has a first end connected to the first electrode 11 and a second end connected to the first column 31.

In the connection 30A, the first column 31 is constituted by a material that is higher in thermal activity than a material that constitutes the second column 32. The "thermal activity" herein refers to a degree of activity with respect to heat and, for example, can be expressed as the tendency of metal atoms to diffuse during metal joining. Further, the "thermal activity" herein can be expressed by a measure of how high or low a temperature pertaining to diffusion joining is and a measure of how long or short joining time is.

For example, by using, as the material that constitutes the first column 31, a material that is lower in melting point than the material that constitutes the second column 32, the thermal activity of the material that constitutes the first column 31 can be made higher than the thermal activity of the material that constitutes the second column 32.

The second column 32 can be formed, for example, by a plating method (e.g. electrolytic plating or non-electrolytic plating) and photolithography. In a case where the second column 32 is formed by a plating method, platinum (with a melting point 1774° C.), palladium (with a melting point of 1555° C.), nickel (with a melting point of 1455° C.), copper (with a melting point of 1083° C.), gold (with a melting point of 1063° C.), silver (with a melting point 961° C.), lead (with a melting point of 328° C.), tin (with a melting point of 232° C.), iridium (with a melting point of 157° C.), which are named in descending order of melting point, or other materials can for example be used as the material.

Further, for example, in a case where a substance that constitutes the first column 31 and a substance that constitutes the second column 32 are identical, the thermal activity of the material that constitutes the first column 31 can be made higher than the thermal activity of the material that constitutes the second column 32 by using conductive nanoparticles as the material that constitutes the first column 31. The term "conductive nanoparticles" herein means a conductive material having an average particle diameter of 100 nm or smaller. Since the conductive nanoparticles have small average particle diameters, they allow metal atoms to easily move. This makes it possible to lower the junction temperature at which to join the first semiconductor chip 10 and the second semiconductor chip 20 to each other. This makes it possible to reduce thermal stress that is applied to the connection 30A. The conductive nanoparticles are diffused in a solvent or the like in a pre-joined state, and after joining, the solvent gets its component decomposed and evaporated, whereby only the conductive nanoparticles get sintered.

By thus constituting the first column 31 of a material with high thermal activity, joining can be performed at low temperature in an interconnection that requires miniaturization. This makes it possible to achieve strong joining.

Note here that in an external connection at which to mount a semiconductor chip on a printed circuit board, a junction has a diameter of approximately 200 µm to 1 mm and joining takes place at pitches of approximately 400 µm to 2 mm. On the other hand, in an interconnection, the planar size of an electrode of a semiconductor chip (in a case where the shape of the electrode is a square, the length of each side, or in a case where the shape of the electrode is a rectangle, the length of a short side) needs to be 100 µm or smaller. Therefore, the cross-sectional size of the connection 30A (i.e. the length a cross-section of the connection 30A that is perpendicular to a direction (in FIG. 1, a vertical direction) in which the first semiconductor chip 10 and the second semiconductor chip 20 are stacked; in a case where the length and breadth of a cross-sectional shape of the connection 30A are neither longer nor shorter than each other as in the case of a circle or a regular polygon, the length of the cross-sectional shape in a longitudinal direction or a transverse direction, or in a case where the length and breadth of the cross-sectional shape are longer or shorter than each other as in the case of an ellipse or a rectangle, the length of the short diameter or a short side) needs to be 100 µm or smaller. Further, such connections 30A need to be placed at pitches of approximately 200 µm or shorter. Further, depending on the types of the first and second semiconductor chips 10 and 20 to be stacked, the cross-sectional size of the connection 30A needs to be 20 µm or smaller (in some case, 3 µm or smaller) and such connections 30A need to be placed at pitches of 40 µm or shorter (in some cases, 4 µm or shorter). In the connection 30A according to Embodiment 1, by using the conductive nanoparticles as the material that constitutes the first column 31, a first column 31 that satisfies the aforementioned conditions can be formed in an interconnection that minutely and electrically connect semiconductor chips to each other.

It should be noted that in the case of further forming a secondary wire on a semiconductor chip that is manufactured by a wafer process, it is possible to enlarge the size of an electrode, but a cumbersome manufacturing process will result.

For example, in a case where gold nanoparticles are used as the substance that constitutes the first column 31, the gold nanoparticles can be sintered at approximately 200 to 300° C. Therefore, joining can be performed at a temperature that is lower than the junction temperature (350° C.) in a bulk state such as a case where plating or the like are used for formation.

Further, in the case of needing to join the first semiconductor chip 10 and the second semiconductor chip 20 to each other at a further lower temperature, silver nanoparticles can be used as the substance that constitutes the first column 31. This makes it possible to lower the junction temperature to 100 to 200° C.

Further, promoting diffusion of metal atoms during joining of the first semiconductor chip 10 and the second semiconductor chip 20 is also possible in a plating method. Specifically, crystal grains are made smaller by adjusting the type of a plating solution, adding additives to the plating solution, or letting plating grow slowly. This makes it possible to promote diffusion of metal atoms. Further, promoting diffusion of metal atoms makes it possible to promote the growth of an alloy layer in a case where joint surfaces are made of metals that are different from each other. Further, even when the joint surfaces are made of metals that are identical to each other, the diffusion of metal atoms at the junction easily progresses, so that strong joining becomes possible. This makes it possible to shorten the heating time required for diffusion joining and also makes it possible to inhibit ion migration.

For example, a small-sized display that is mounted in spectacles or goggles for use in AR or VR includes a semiconductor chip stack, measuring approximately 1 cm each side, that has an LED element mounted on an LED (light-emitting diode) driving LSI (large-scale integration) chip. In such a semiconductor chip stack, the LED element is sized so that the length of a short side is 20 μm or shorter or, in the case of a megapixel, 3 μm or shorter. Further, the LED element needs to have one connection formed in a short side direction and two connections formed in a long side direction. Therefore, the cross-sectional size of each connection needs to be 20 μm or smaller or, in the case of a megapixel, 3 μm or smaller. For this reason, with the paste that is used in mounting a semiconductor device on a printed circuit board, it is difficult to form a first column 31 of the present disclosure, as the paste has a particle diameter of approximately 20 to 30 μm. On the other hand, using the conductive nanoparticles makes it possible to easily form the first column 31.

Further, in a case where connections are formed at pitches of 40 μm or shorter (in some case, pitches of 4 μm or shorter), attention needs to be paid to ion migration of materials that constitute the connections. Note here that the materials are arranged in descending order of tendency for ion migration as follows: silver>lead≥copper>tin>gold, palladium, and platinum. Using a material, such as silver, lead, or tin, that can be joined at a comparatively low temperature makes it easy to stack semiconductor chips; however, for example, constituting all of the connections of these materials makes ion migration tend to take place, as the materials are large in volume.

To address this problem, it is preferable that the material that constitutes the first column 31 be a material that can be joined at a comparatively low temperature and the material that constitutes the second column 32 be a material that is less prone to ion migration than or a material that is as prone to ion migration as the material that constitutes the first column 31. It should be noted that it is more preferable that the material that constitutes the second column 32 be a material that is less prone to ion migration than the material that constitutes the first column 31. The second column 32 is formed to be larger in volume than the first column 31. This makes it possible to inhibit ion migration.

For example, in the case of forming the first column 31 of silver, forming the second column 32 of copper makes it possible to more inhibit ion migration than in the case of forming a connection solely of silver. Further, forming the second column 32 of tin makes it possible to further inhibit ion migration. Further, forming the second column 32 of gold makes it possible to further inhibit ion migration. Further, forming the second column 32 of palladium or platinum makes it possible to inhibit ion migration as in the case of gold. Ion migration is affected by impurity ions from a resist residue that is mixed in the manufacturing process, the temperature and humidity of operating conditions, and the like, and ion migration may also take place in a case where the second column 32 is formed of a substance (e.g. lead, copper, or tin) that is less prone to ion migration than silver. In such a case, the second column 32 needs only be formed of a substance (e.g. gold, palladium, or platinum) that is further less prone to ion migration.

Further, for example, in a case where ion migration tends to take place even when the connection 30A is formed entirely of copper, the first column 31 may be formed of copper nanoparticles and the second column 32 may be formed of tin. Further, forming the second column 32 of gold, palladium, or platinum makes it possible to further inhibit ion migration. In a case where ion migration takes place in the configuration, ion migration can be further inhibited by forming the first column 31 of tin and forming the second column 32 of gold, palladium, or platinum. It should be noted that lead-free solder contains tin with a ratio of 95% or higher and, since tin is dominant, is as prone to ion migration as tin.

Next, the sizes of the first column 31 and the second column 32 are described. The first column 31 is made smaller in volume than the second column 32. Further, it is preferable that the first column 31 be formed to be as small in volume as possible insofar as the first semiconductor chip 10 and the second semiconductor chip 20 can be sufficiently joined to each other. Note here that in an interconnection, as mentioned above, the first electrode 11 and the second electrode 21 need to be made minute in size; therefore, it is preferable that the length of the second column 32 in a height direction (direction in which the first semiconductor chip 10 and the second semiconductor chip 20 are stacked) be as long as possible. For example, in a case where the cross-sectional size of the connection 30A (i.e. the length of a cross-section of the connection 30A ion that is perpendicular to a direction (in FIG. 1, a vertical direction) in which the first semiconductor chip 10 and the second semiconductor chip 20 are stacked; in a case where the length and breadth of a cross-sectional shape of the connection 30A are neither longer nor shorter than each other as in the case of a circle or a regular polygon, the length of the cross-sectional shape in a longitudinal direction or a transverse direction, or in a case where the length and breadth of the cross-sectional shape are longer or shorter than each other as in the case of an ellipse or a rectangle, the length of the short diameter or a short side) is 20 to 100 µm, the length of the first column 31 in the height direction may be 5 to 5000 nm and the length of the second column 32 in the height direction may be 10 to 200 µm. Further, in a case where the cross-sectional size of the connection 30A is 1 to 20 µm, the length of the first column 31 in the height direction may be 5 to 5000 nm and the length of the second column 32 in the height direction may be 0.5 to 40 µm. Further, it is preferable that the aspect ratio of the connection 30A in the height direction (i.e. the ratio of the length of the connection 30A in the height direction to the cross-sectional size of the connection 30A) be 0.5 to 5.

Further, in order to further inhibit ion migration, it is preferable to increase the alloying ratio of the highly thermally-active material of the first column 31 (i.e. the ratio of an alloy to the whole volume of the first column 31).

The following describes a case of using a GaN, GaAs, or GaIn LED chip (which may be constituted by a single LED element or may include multiple LED elements) or the like as the second semiconductor chip 20 and using a Si LED-driving LSI as the first semiconductor chip 10. In this case, the first semiconductor chip 10 and the second semiconductor chip 20 have different coefficients of liner expansion. Therefore, it is preferable to lower the junction temperature in stacking the first semiconductor chip 10 and the second semiconductor chip 20 and electrically connecting them via the connection 30A. In Embodiment 1, as mentioned above, the first column 31 is constituted by a material that is higher in thermal activity than the material that constitutes the second column 32. This makes it possible to lower the junction temperature. This makes it possible to easily perform alignment at the time of joining even if there is a difference in coefficient of linear expansion between the first semiconductor chip 10 and the second semiconductor chip 20.

Further, a semiconductor chip stack suffers from stress (thermal stress) generated at a connection due to strain produced between a first semiconductor chip and a second semiconductor chip in returning to room temperature after joining. On the other hand, in the connection 30A according to Embodiment 1, as mentioned above, the first column 31 is constituted by a highly thermally-active material. This makes it possible to lower the junction temperature and therefore makes it possible to reduce thermal stress. Furthermore, in the connection 30A, the second column 32 is formed to be larger in volume than the first column 31. This makes it possible to diffuse thermal stress that is applied to the connection 30A. This makes it possible to reduce the thermal stress. Specifically, it is preferable that the aspect ratio of the connection 30A in the height direction be 0.5 or higher.

The following further details the foregoing statement that the second semiconductor chip 20 may include a single element or multiple elements. In the case of mounting a single-element second semiconductor chip 20 on the first semiconductor chip 10, it is necessary to mount as many second semiconductor chips 20 as pixels. Further, in the case of mounting a multiple-element second semiconductor chip 20, it is only necessary to mount a single second semiconductor chip 20 that includes as many elements as the pixels, or multiple second semiconductor chips 20 that do not include as many elements as the pixels may be mounted so that the number of elements corresponds to the number of pixels. It should be noted that while the second semiconductor chip 20 has been mentioned here, the first semiconductor chip 10 too may include only a single element or may include multiple elements.

Method for Manufacturing Semiconductor Chip Stack 1A

FIGS. 2A to 2E are diagrams for explaining a method for manufacturing a semiconductor chip stack 1A. It should be noted that FIGS. 2A to 2E omit to illustrate a first electrode 11 or a second electrode 21.

Figure 2A:
FIGS. 2A to 2E are diagrams for explaining a method for manufacturing the semiconductor chip stack.

In the manufacture of the semiconductor chip stack 1A, as shown in FIG. 2A, a first semiconductor chip 10 is prepared.

Figure 2B:
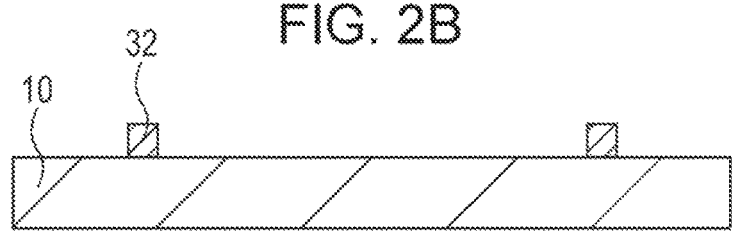

Next, as shown in FIG. 2B, a second column 32 is formed on the first electrode 11 of the first semiconductor chip 10 as a part of a connection 30A (forming a second column). The second column 32 can be formed by a plating method (e.g. electrolytic plating or non-electrolytic plating) and photolithography.

Figure 2C:

Next, as shown in FIG. 2C, a first column 31 is formed on the second column 32 (forming a first column). The first column 31 can be formed by a plating method (e.g. electrolytic plating or non-electrolytic plating). Specifically, the first column 31 is formed on the second column 32 by a plating method with use of a pattern formed with a resist opening for forming the second column 32. At this point of time, the first column 31 is constituted by a material that is smaller in crystal grain size than a material that constitutes the second column 32. The first column 31 is formed to be smaller in volume than the second column 32.

Next, the resist is stripped. It should be noted that, if necessary, the resist residue may be removed in advance by plasma processing with argon plasma, oxygen plasma, or the like. This makes it possible to inhibit ion migration from the connection 30A. In this way, the first column 31 is formed on the second column 32. That is, the connection 30A is formed.

It should be noted that the first column 31 may be formed by a method other than the method described above. In an aspect of the present disclosure, the first column 31 may be formed by a method hereinafter prescribed. First, after the formation of the second column 32, the resist provided in forming the second column 32 is stripped. It should be noted that, if necessary, the resist residue may be removed in advance by plasma processing with argon plasma, oxygen plasma, or the like. Next, conductive nanoparticles serving as a material for constituting the first column 31 are applied to the second column 32. The conductive nanoparticles can be applied, for example, by a printing method or an inkjet method. The inkjet method is advantageous to miniaturization, as it allows application of small amounts of various kinds or, in terms of application to a minute region, application to a 1-µm-level region.

For example, in a case where the second column 32 is formed by a plating method with use of gold and the first column 31 is formed by gold nanoparticles, the particle diameter of the material that constitutes the second column 32 is approximately 1 µm (100 nm to several micrometers) and the particle diameter of the material that constitutes the first column 31 is approximately 1 to 100 nm.

Figure 2D:
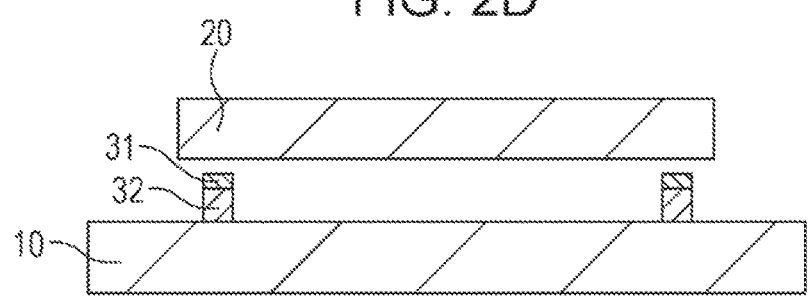

After the first column 31 has been formed, a second semiconductor chip 20 is prepared. Next, as shown in FIG. 2D, the connection 30A formed on the first electrode 11 and the second electrode 21 of the second semiconductor chip 20 are aligned with each other.

Figure 2E:
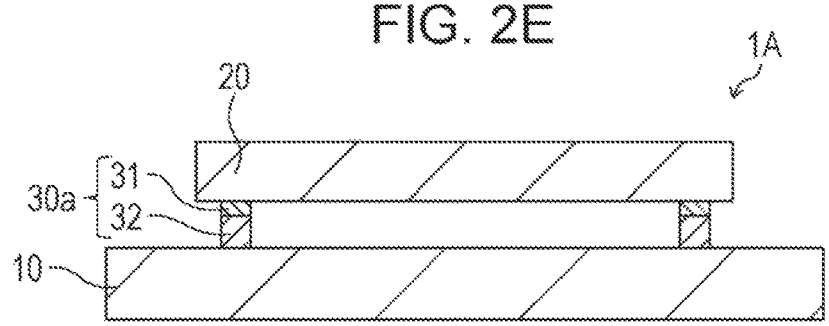

Next, as shown in FIG. 2E, the second electrode 21 and the connection 30A are joined to each other by thermocompression (joining). In other words, the first semiconductor chip 10 and the second semiconductor chip 20 are joined to each other via the first column 31. In an aspect of the present disclosure, the second electrode 21 needs only be placed on the connection 30A. In this case, after the second electrode 21 has been placed on the connection 30A, heating is performed with use of an oven or a furnace so that an alloy layer grows to a desired degree. This makes it possible to promote alloying. Allowing the alloy layer to grow to the desired degree makes it possible to inhibit ion migration.

Specifically, the second electrode 21 and the connection 30A are joined to each other by mounting with use of a flip-chip bonder, a mounter, or the like (it is preferable that thermocompression be performed at this point of time) followed by heating with use of an oven or a furnace.

In an aspect of the present disclosure, in the semiconductor chip stack in which the first semiconductor chip 10 and the second semiconductor chip 20 are stacked via the connection 30A, a resin material may be provided between the first semiconductor chip 10 and the second semiconductor chip 20 in order to protect the connection 30A.

Further, although, in the manufacturing method according to Embodiment 1, the first semiconductor chip 10 and the second semiconductor chip 20 are joined to each other after the second column 32 and the first column 31 have been formed on the side of the first semiconductor chip 10, this is not intended to limit a manufacturing method of the present disclosure. In a manufacturing method according to an aspect of the present disclosure, the first semiconductor chip 10 and the second semiconductor chip 20 may be joined to each other after the second column 32 and the first column 31 have been formed on the side of the second semiconductor chip 20.

Modification

The following describes a modification of the method for manufacturing a semiconductor chip stack 1A. FIGS. 3A to 3D are diagrams for explaining a modification of the method for manufacturing a semiconductor chip stack 1A according to Embodiment 1.

Figure 3A:
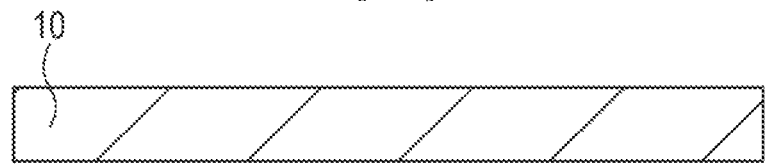
FIGS. 3A to 3D are diagrams for explaining a modification of the method for manufacturing the semiconductor chip stack.
Figure 3B:

In the method for manufacturing a semiconductor chip stack 1A according to the modification, first, as shown in FIG. 3A, a first semiconductor chip 10 is prepared. Next, as shown in FIG. 3B, a second column 32 is formed on a first electrode 11 of the first semiconductor chip 10 as a part of a connection 30A. This step is similar to that of Embodiment 1 and, as such, is not described here.

Figure 3C:
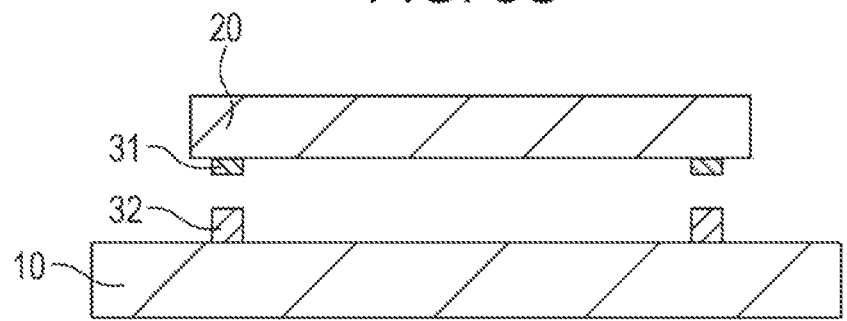

Next, as shown in FIG. 3C, a first column 31 is formed on a second semiconductor chip 20. The first column 31 can be formed by a plating method (e.g. electrolytic plating or non-electrolytic plating).

Figure 3D:
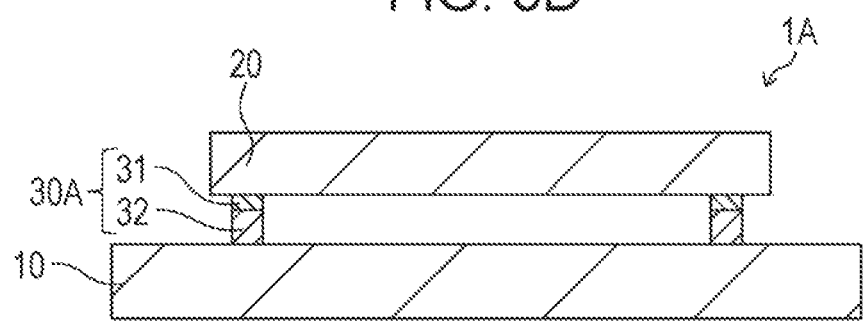

Then, as shown in FIG. 3D, the first column 31 and the second column 32 are joined to each other by thermocompression, whereby the connection 30A is formed. As a result, the semiconductor chip stack 1A can be manufactured.

In a manufacturing method according to an aspect of the present disclosure, the first column 31 and the second column 32 may be joined to each other by thermocompression after the first column 31 has been formed on the first semiconductor chip 10 and the second column 32 has been formed on the second semiconductor chip 20.

Embodiment 2

Another embodiment of the present disclosure is described below. For convenience of explanation, members having the same functions as those described in Embodiment 1 are given the same signs and are not repeatedly described below.

Structure of Semiconductor Chip Stack 1B

Figure 4A:
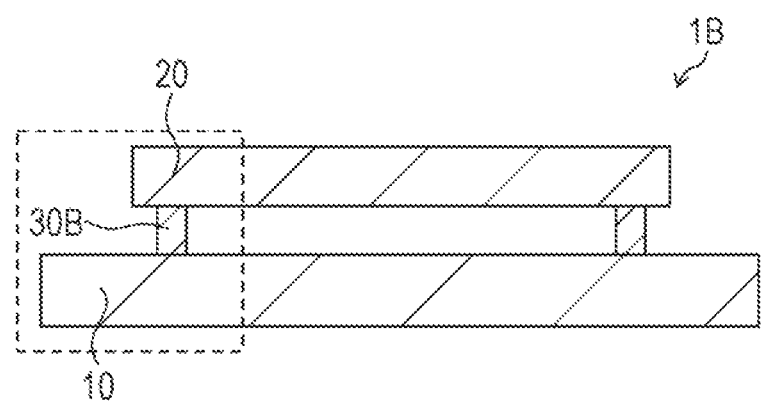
FIG. 4A is a cross-sectional view showing a structure of a semiconductor chip stack according to Embodiment 2 of the present disclosure.
Figure 4B:
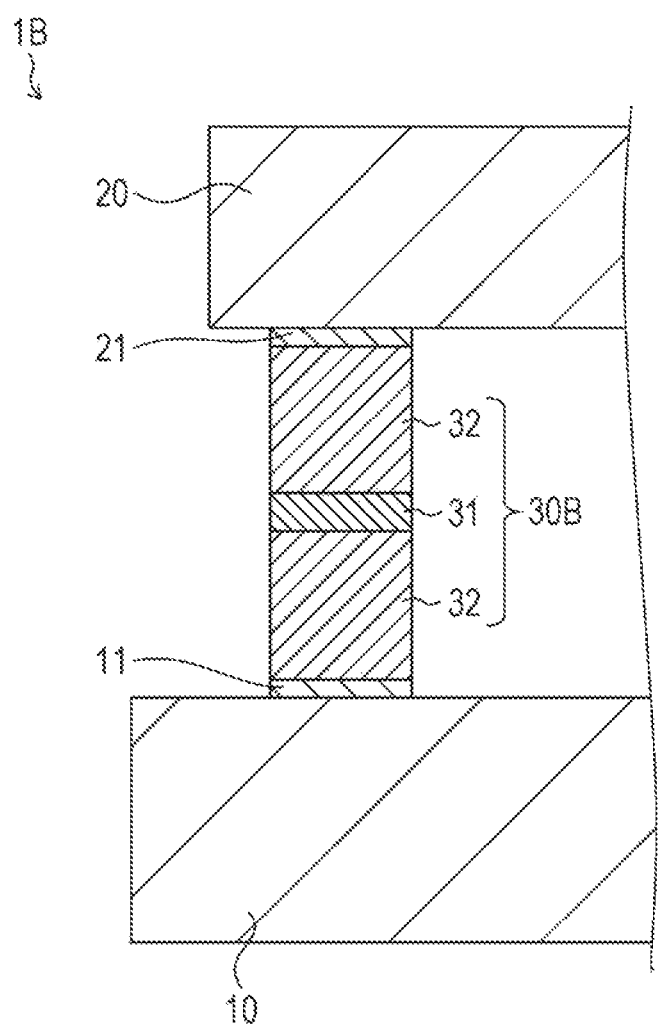
FIG. 4B is an enlarged view of a part of FIG. 4A surrounded by dotted lines.

FIG. 4A is a cross-sectional view showing a structure of a semiconductor chip stack 1B according to Embodiment 2, and FIG. 4B is an enlarged view of a part of FIG. 4A surrounded by dotted lines. As shown in FIG. 4A, the semiconductor chip stack 1B includes a connection 30B instead of the connection 30A according to Embodiment 1.

The connection 30B includes one first column 31 and two second columns 32, and is structured such that the first column 31 is sandwiched between the two second columns 32.

One of the second columns 32 has a first end connected to the first electrode 11 of the first semiconductor chip 10 and a second end connected to the first column 31. The other of the second columns 32 has a first end connected to the second electrode 21 of the second semiconductor chip 20 and a second end connected to the first column 31. The first column 31 is formed to be have a volume that is smaller than the total volume of the two second columns 32.

In the connection 30B, as mentioned above, the second columns 32 are disposed on both sides, respectively, of the first column 31. This makes it possible to facilitate alloying of the first column 31 and the second columns 32. This increases the alloying ratio and therefore makes it possible to enhance the effect of inhibiting ion migration in addition to the effects mentioned in Embodiment 1.

Further, in the connection 30B, the first column 31, which is prone to ion migration, is disposed in a location away from the first semiconductor chip 10 and the second semiconductor chip 20. This makes it possible to inhibit a short circuit from occurring between the connection 30B and another connection 30B due to ion migration.

The two second columns 32 need only be constituted by a material that is lower in thermal activity than a material that constitutes the first column 31. The two second columns 32 may be constituted by the same material or different materials, provided this condition is satisfied. It should be noted that constituting the two second columns 32 of the same material makes it possible to easily manufacture the connection 30B.

Method for Manufacturing Semiconductor Chip Stack 1B

FIGS. 5A to 5D are diagrams for explaining a method for manufacturing a semiconductor chip stack 1B.

Figure 5A:
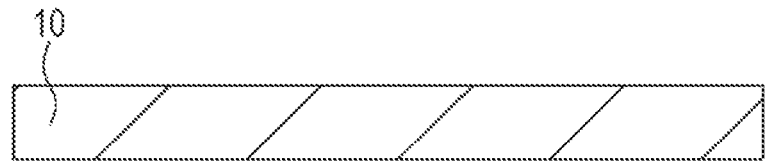
FIGS. 5A to 5D are diagrams for explaining a method for manufacturing the semiconductor chip stack.

In the method for manufacturing a semiconductor chip stack 1B, as shown in FIG. 5A, first, a first semiconductor chip 10 is prepared.

Figure 5B:
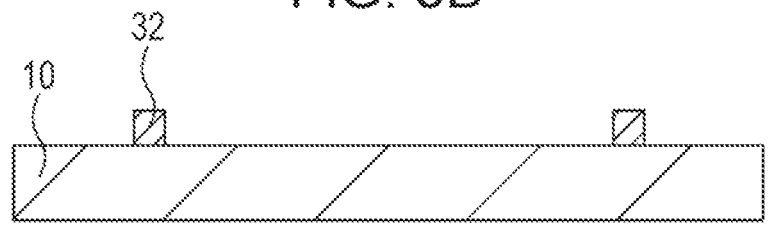

Next, as shown in FIG. 5B, a second column 32 is formed on a first electrode 11 of the first semiconductor chip 10 as a part of a connection 30B. This step is similar to that of Embodiment 1 and, as such, is not described here.

Figure 5C:
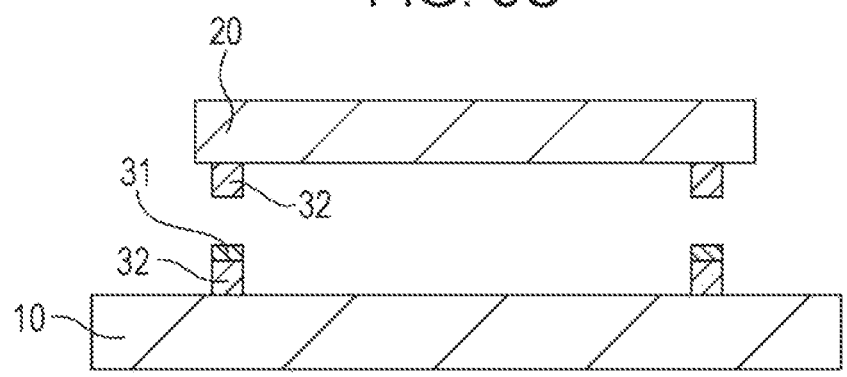

Next, as shown in FIG. 5C, a first column 31 is formed on the second column 32 formed on the first semiconductor chip 10. Further, a second column 32 is formed on a second electrode 21 of a second semiconductor chip 20 as a part of the connection 30B.

Next, as shown in FIG. 5C, the first column 31 formed on the first semiconductor chip 10 and the second column 32 formed on the second semiconductor chip 20 are aligned with each other.

Figure 5D:
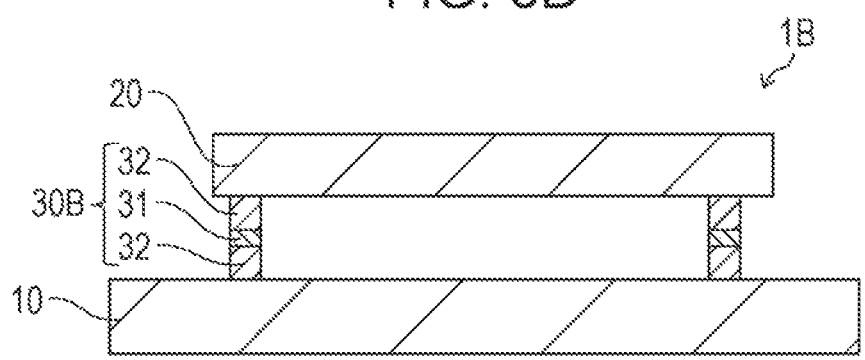
Figure 6:
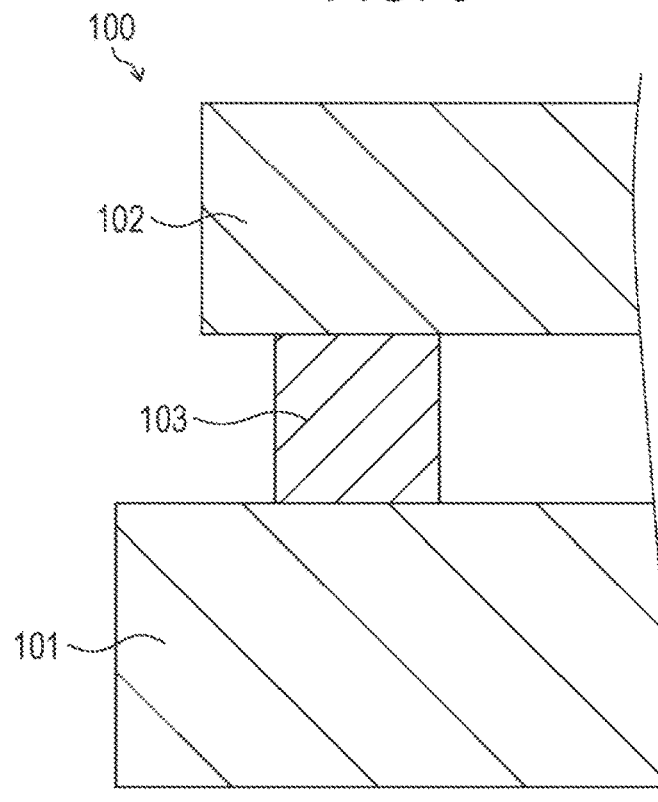
FIG. 6 is a cross-sectional view showing a structure of a conventional semiconductor chip stack.
Figure 7:
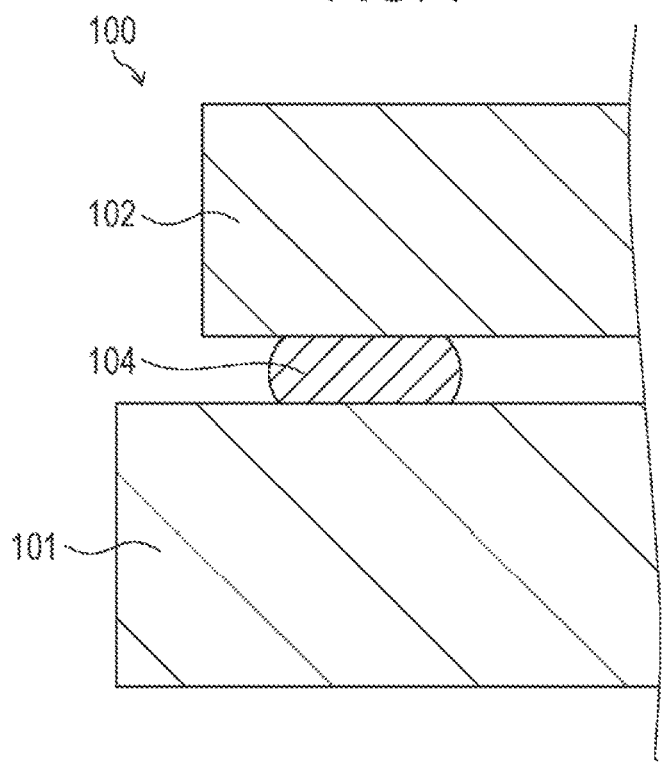
FIG. 7 is a cross-sectional view showing a structure of another conventional semiconductor chip stack.

Next, as shown in FIG. 5D, the first column 31 formed on the first semiconductor chip 10 and the second column 32 formed on the second semiconductor chip 20 are joined to each other by thermocompression. As a result, the connection 30B is formed, and the first semiconductor chip 10 and the second semiconductor chip 20 are joined to each other. In an aspect of the present disclosure, the second column 32 formed on the second semiconductor chip 20 needs only be placed on the first column 31 formed on the first semiconductor chip 10. In this case, after the second column 32 formed on the second semiconductor chip 20 has been placed on the first column 31 formed on the first semiconductor chip 10, heating is performed with use of an oven or a furnace so that an alloy layer grows to a desired degree. This makes it possible to promote alloying. Allowing the alloy layer to grow to the desired degree makes it possible to inhibit ion migration. In so doing, increasing the alloying ratio in advance makes it possible to further inhibit ion migration.

In an aspect of the present disclosure, in the semiconductor chip stack in which the first semiconductor chip 10 and the second semiconductor chip 20 are stacked via the connection 30B, a resin material may be provided between the first semiconductor chip 10 and the second semiconductor chip 20 in order to protect the connection 30B.

CONCLUSION

According to Aspect 1 of the present disclosure, there is provided a semiconductor chip stack including: a first semiconductor chip having a first electrode; a second semiconductor chip having a second electrode; and a connection via which the first electrode and the second electrode are electrically connected to each other, the first semiconductor chip and the second semiconductor chip being stacked, wherein the connection includes a first column and a second column that are lined up along a direction in which the first semiconductor chip and the second semiconductor chip are stacked, the first column is constituted by a material having a higher degree of activity with respect to heat than a material that constitutes the second column and is smaller in volume than the second column, and the connection has an aspect ratio of 0.5 or higher in a height direction.

According to Aspect 2 of the present disclosure, there may be provided the semiconductor chip stack according to Aspect 1, wherein the connection has a cross-sectional size of 1 to 100 μm, the first column has a height of 5 to 5000 nm, and the second column has a height of 0.5 to 200 μm.

According to Aspect 3 of the present disclosure, there may be provided the semiconductor chip stack according to Aspect 1 or 2, wherein the connection has a cross-sectional size of 1 to 20 μm, the first column has a height of 5 to 5000 nm, and the second column has a height of 0.5 to 40 μm.

According to Aspect 4 of the present disclosure, there may be provided the semiconductor chip stack according to any of Aspects 1 to 3, wherein the material that constitutes the first column has a smaller crystal grain size than the material that constitutes the second column.

According to Aspect 5 of the present disclosure, there may be provided the semiconductor chip stack according to any of Aspects 1 to 4, wherein the material that constitutes the first column has a lower melting point than the material that constitutes the second column.

According to Aspect 6 of the present disclosure, there may be provided the semiconductor chip stack according to any of Aspects 1 to 5, wherein the second column is constituted of a material that is less prone to ion migration than or a material that is as prone to ion migration as the material that constitutes the first column.

According to Aspect 7 of the present disclosure, there may be provided the semiconductor chip stack according to any of Aspects 1 to 6, wherein the first semiconductor chip and the second semiconductor chip have different coefficients of linear expansion from each other.

According to Aspect 8 of the present disclosure, there is provided a method for manufacturing a semiconductor chip stack including a first semiconductor chip having a first electrode, a second semiconductor chip having a second electrode, and a connection via which the first electrode and the second electrode are electrically connected to each other, the first semiconductor chip and the second semiconductor chip being stacked, the method including: forming a second column on the first semiconductor chip or the second semiconductor chip as a part of the connection; forming a first column on the first semiconductor chip or the second semiconductor chip as a part of the connection along a direction in which the first semiconductor chip and the second semiconductor chip are stacked, the first column (1) being constituted by a material having a higher degree of activity with respect to heat than a material that constitutes the second column and (2) being smaller in volume than the second column; and joining the first semiconductor chip and the second semiconductor chip to each other via the first column, wherein the connection has an aspect ratio of 0.5 or higher in a height direction.

According to Aspect 9 of the present disclosure, there may be provided the method according to Aspect 8, wherein the connection has a cross-sectional size of 1 to 100 μm, the first column has a height of 5 to 5000 nm, and the second column has a height of 0.5 to 200 μm.

According to Aspect 10 of the present disclosure, there may be provided the method according to Aspect 8 or 9, wherein the connection has a cross-sectional size of 1 to 20 μm, the first column has a height of 5 to 5000 nm, and the second column has a height of 0.5 to 40 μm.

According to Aspect 11 of the present disclosure, there may be provided the method according to any of Aspects 8 to 10, wherein in forming the first column, conductive nanoparticles are used to form the first column.

According to Aspect 12 of the present disclosure, there may be provided the method according to any of Aspects 8 to 11, wherein in forming the first column, a material that is lower in melting point than the second column is used to form the first column.

According to Aspect 13 of the present disclosure, there may be provided the method according to any of Aspects 8 to 12, wherein the second column is constituted of a material that is less prone to ion migration than or a material that is as prone to ion migration as the material that constitutes the first column.

According to Aspect 14 of the present disclosure, there may be provided the method according to any of Aspects 8 to 13, wherein the first semiconductor chip and the second semiconductor chip have different coefficients of linear expansion from each other.

The present disclosure is not limited to any of the embodiments described above, but may be altered in various ways within the scope of the claims. An embodiment based on a proper combination of technical means disclosed in different embodiments is encompassed in the technical scope of the present disclosure. Furthermore, a new technical feature can be formed by a combination of technical means disclosed in the embodiments, respectively.

The present disclosure contains subject matter related to that disclosed in Japanese Priority Patent Application JP 2018-103563 filed in the Japan Patent Office on May 30, 2018, the entire contents of which are hereby incorporated by reference.

What is claimed is:

1. A semiconductor chip stack comprising:
   a first semiconductor chip having a first electrode;
   a second semiconductor chip having a second electrode; and
   a connection via which the first electrode and the second electrode are electrically connected to each other,
   the first semiconductor chip and the second semiconductor chip being stacked,
   wherein the connection includes a first column and a second column that are lined up along a direction in which the first semiconductor chip and the second semiconductor chip are stacked,
   the first column is constituted by a material having a higher degree of activity with respect to heat than a material that constitutes the second column and is smaller in volume than the second column,
   the connection has an aspect ratio of 0.5 or higher in a height direction, and
   wherein the material that constitutes the first column has a smaller crystal grain size than the material that constitutes the second column.

2. The semiconductor chip stack according to claim 1, wherein the connection has a cross-sectional size of 1 to 100 μm,
   the first column has a height of 5 to 5000 nm,
   the second column has a height of 0.5 to 200 μm,
   the cross-sectional size of the connection is the length of the cross-section of the connection that is perpendicular to a direction in which the first semiconductor chip and the second semiconductor chip are stacked, and
   in a case where the length and breadth of a cross-sectional shape of the connection are neither longer nor shorter than each other as in the case of a circle or a regular polygon, the cross-sectional size of the connection is the length of the cross-sectional shape in a longitudinal direction or a transverse direction, or in a case where the length and breadth of the cross-sectional shape are longer or shorter than each other as in the case of an ellipse or a rectangle, the cross-sectional size of the connection is the length of the short diameter or a short side.

3. The semiconductor chip stack according to claim 1, wherein the connection has a cross-sectional size of 1 to 20 μm,
   the first column has a height of 5 to 5000 nm,
   the second column has a height of 0.5 to 40 μm,
   the cross-sectional size of the connection is the length of the cross-section of the connection that is perpendicular to a direction in which the first semiconductor chip and the second semiconductor chip are stacked, and
   in a case where the length and breadth of a cross-sectional shape of the connection are neither longer nor shorter than each other as in the case of a circle or a regular polygon, the cross-sectional size of the connection is the length of the cross-sectional shape in a longitudinal direction or a transverse direction, or in a case where the length and breadth of the cross-sectional shape are longer or shorter than each other as in the case of an ellipse or a rectangle, the cross-sectional size of the connection is the length of the short diameter or a short side.

4. The semiconductor chip stack according to claim 1, wherein the material that constitutes the first column has a lower melting point than the material that constitutes the second column.

5. A semiconductor chip stack comprising:
   a first semiconductor chip having a first electrode;
   a second semiconductor chip having a second electrode; and
   a connection via which the first electrode and the second electrode are electrically connected to each other,
   the first semiconductor chip and the second semiconductor chip being stacked,
   wherein the connection includes a first column and a second column that are lined up along a direction in which the first semiconductor chip and the second semiconductor chip are stacked,
   the first column is constituted by a material having a higher degree of activity with respect to heat than a material that constitutes the second column and is smaller in volume than the second column,
   the connection has an aspect ratio of 0.5 or higher in a height direction, and
   wherein the second column is constituted of a material that is less prone to ion migration than or a material that is as prone to ion migration as the material that constitutes the first column.

6. The semiconductor chip stack according to claim 1, wherein the first semiconductor chip and the second semiconductor chip have different coefficients of linear expansion from each other.

7. A method for manufacturing a semiconductor chip stack including a first semiconductor chip having a first electrode, a second semiconductor chip having a second electrode, and a connection via which the first electrode and the second electrode are electrically connected to each other, the first semiconductor chip and the second semiconductor chip being stacked, the method comprising:
   forming a second column on the first semiconductor chip or the second semiconductor chip as a part of the connection;
   forming a first column on the first semiconductor chip or the second semiconductor chip as a part of the connection along a direction in which the first semiconductor chip and the second semiconductor chip are stacked, the first column (1) being constituted by a material having a higher degree of activity with respect to heat than a material that constitutes the second column and (2) being smaller in volume than the second column;
   joining the first semiconductor chip and the second semiconductor chip to each other via the first column,
   wherein the connection has an aspect ratio of 0.5 or higher in a height direction, and
   wherein the second column is constituted of a material that is less prone to ion migration than or a material that is as prone to ion migration as the material that constitutes the first column.

8. The method according to claim 7, wherein the connection has a cross-sectional size of 1 to 100 μm,
   the first column has a height of 5 to 5000 nm, and
   the second column has a height of 0.5 to 200 μm.

9. The method according to claim 7, wherein the connection has a cross-sectional size of 1 to 20 μm,
   the first column has a height of 5 to 5000 nm, and
   the second column has a height of 0.5 to 40 μm.

10. The method according claim 7, wherein in forming the first column, conductive nanoparticles are used to form the first column.

11. The method according claim 7, wherein in forming the first column, a material that is lower in melting point than the second column is used to form the first column.

12. The method according claim 7, wherein the first semiconductor chip and the second semiconductor chip have different coefficients of linear expansion from each other.

* * * * *